United States Patent [19]

Jinbo et al.

[11] Patent Number: 5,480,746
[45] Date of Patent: Jan. 2, 1996

[54] PHOTOMASK AND METHOD OF FORMING RESIST PATTERN USING THE SAME

[75] Inventors: Hideyuki Jinbo; Yoshio Yamashita, both of Tokyo, Japan

[73] Assignee: Oki Electric Industry Co., Ltd., Tokyo, Japan

[21] Appl. No.: 248,633

[22] Filed: May 16, 1994

Related U.S. Application Data

[63] Continuation of Ser. No. 954,033, Sep. 30, 1992, abandoned.

[30] Foreign Application Priority Data

| Oct. 1, 1991 | [JP] | Japan | 3-278965 |
| Mar. 13, 1992 | [JP] | Japan | 4-088317 |

[51] Int. Cl.⁶ ............................................. G03F 9/00
[52] U.S. Cl. ............................. 430/5; 430/311; 430/326
[58] Field of Search ............................... 430/5, 311, 326

[56] References Cited

U.S. PATENT DOCUMENTS

| 5,045,417 | 9/1991 | Okamoto | 430/5 |
| 5,147,812 | 9/1992 | Gilbert et al. | 437/41 |

FOREIGN PATENT DOCUMENTS

| 0090924 | 10/1983 | European Pat. Off. . |
| 0383534 | 8/1990 | European Pat. Off. . |
| 0395425 | 10/1990 | European Pat. Off. . |
| 0401795 | 12/1990 | European Pat. Off. . |
| 2641622 | 7/1990 | France . |
| 62-59296 | 12/1987 | Japan . |

OTHER PUBLICATIONS

A new phase–shifting Mask Structure for Positive Resist Process (J. Miyazaki et al.) SPIE vol. 1464, 1991.

Proceedings of the 37th Symposium on Semiconductors and Integrated Circuits Technology, Tokyo Dec. 7, 8, 1989, The Electrochemical Society of Japan, electronic Materials Committee.

A Study of Phase Shifting Mask Construction Applied for Positive Resist Process, The 51th Autum Meeting, 1990, The Japan Society of Applied Physics, Lecture No. 27p–ZG–6, p. 492.

Improving Resolution in Photolighography with a phase–shifting Mask, M. D. Levenson et al. IEEE Trans. Electron Device, V. ED29, No. 12, Dec. 1982, pp. 1828–1836.

0.3 Micron optical Lithography using a phase–shifting mask, T. Terasawa et al. SPIE Peoc. 1088, pp. 25–33, 1989.

Primary Examiner—Mark A. Chapman
Attorney, Agent, or Firm—Spencer, Frank & Schneider

[57] ABSTRACT

A photomask for use in forming a photoresist pattern by projection exposure, comprising opaque stripes respectively arranged on a mask substrate at a given pitch and phase shifters formed alternately on light-transmissive areas between said opaque stripes. The widths of the opaque stripes are larger than those of said light-transmissive areas whereby the edges of said phase shifters on said light-transmissive areas are prevented from being transferred to a wafer.

5 Claims, 5 Drawing Sheets

FIG. I
PRIOR ART

PHOTOMASK AND METHOD OF FORMING RESIST PATTERN USING THE SAME

This application is a continuation of application Ser. No. 07/954,033, filed Sep. 30, 1992 now abandoned.

FIELD OF THE INVENTION

The present invention relates to a photomask and a method of forming a photoresist pattern using the same which are adapted an integrated semiconductor manufacturing process.

BACKGROUND OF THE INVENTION

Various techniques for forming fine photoresist patterns have been proposed for the purpose of realizing highly integrated semiconductor devices in the field of photolithography. The techniques employ the method of projecting light for exposure. The phase shifting exposure method is one attractive fine pattern forming method.

The phase shifting method is, for example, disclosed in Japanese Patent Publication No. 62-59296.

A conventional phase shifting mask will be described hereinafter with reference to FIG. 1. In FIG. 1, an array of chromium patterns 22 is formed on a mask substrate 21. The chromium patterns 22 are stripe-shaped and arranged respectively at a given pitch. The areas on which the chromium patterns 22 are formed are opaque, and others are light-transmissive areas.

Thin films (phase shifters) 23 for shifting the phase of light are formed on every other light-transmissive area and between the chromium patterns 22. The widths of the chromium pattern $L_1$ are equal to those of the light-transmissive spaces $S_1$ between the chromium patterns 22. The phase shifter improves the contrast of light and the resolution of the pattern image formed on a wafer.

However, when the photomask is employed to form a positive type resist pattern, unnecessary patterns ,may not be completely removed due to the transfer of the edges 24 of the phase shifters 23 on light-transmissive areas. This problem is disclosed in PROCEEDINGS OF THE 37TH SYMPOSIUM ON SEMICONDUCTORS AND INTEGRATED CIRCUITS TECHNOLOGY, 1989, pp 13 to 16.

On the other hand, a measure for the transfer prevention is disclosed in EXTENDED ABSTRACTS OF THE 51st AUTUMN MEETING, 1990, THE JAPAN SOCIETY OF APPLIED PHYSICS, Lecture No. 27p-ZG-6, p. 492.

In the conventional phase shifting mask, if the edge of the phase shifter exists in a light-transmissive area, the intensity of light at the position corresponding to the edge on the wafer is reduced to zero. According to the proposal of the above literature, a film with a thickness corresponding to the phase difference of 90° (sub-shifter) is formed at the edge of the phase shifter and thereby the decrease in intensity of light is moderated so as to prevent the transfer of the edge of the phase shifter.

This method, however, needs at least two kinds of shifters having different thickness thereby, complicating the manufacturing process and increasing the manufacturing cost.

SUMMARY OF THE INVENTION

It is an object of the present invention to provide a photomask which can eliminate the transfer of the edge of a phase shifter in light-transmissive areas.

It is another object of the present invention to provide a photomask which is manufactured easily with low cost.

It is still another object of the present invention to provide a method of forming photoresist patterns using the above photomask.

In order to attain the above objects, the photomask according to the present invention is characterized by opaque stripes each arranged at a given pitch on a mask substrate and phase shifters formed on the light-transmissive areas between the stripes, wherein the width of each of the opaque stripe is wider than that of each of the spaces therebetween.

DESCRIPTION OF THE PREFERRED EMBODIMENTS

Figure 2:
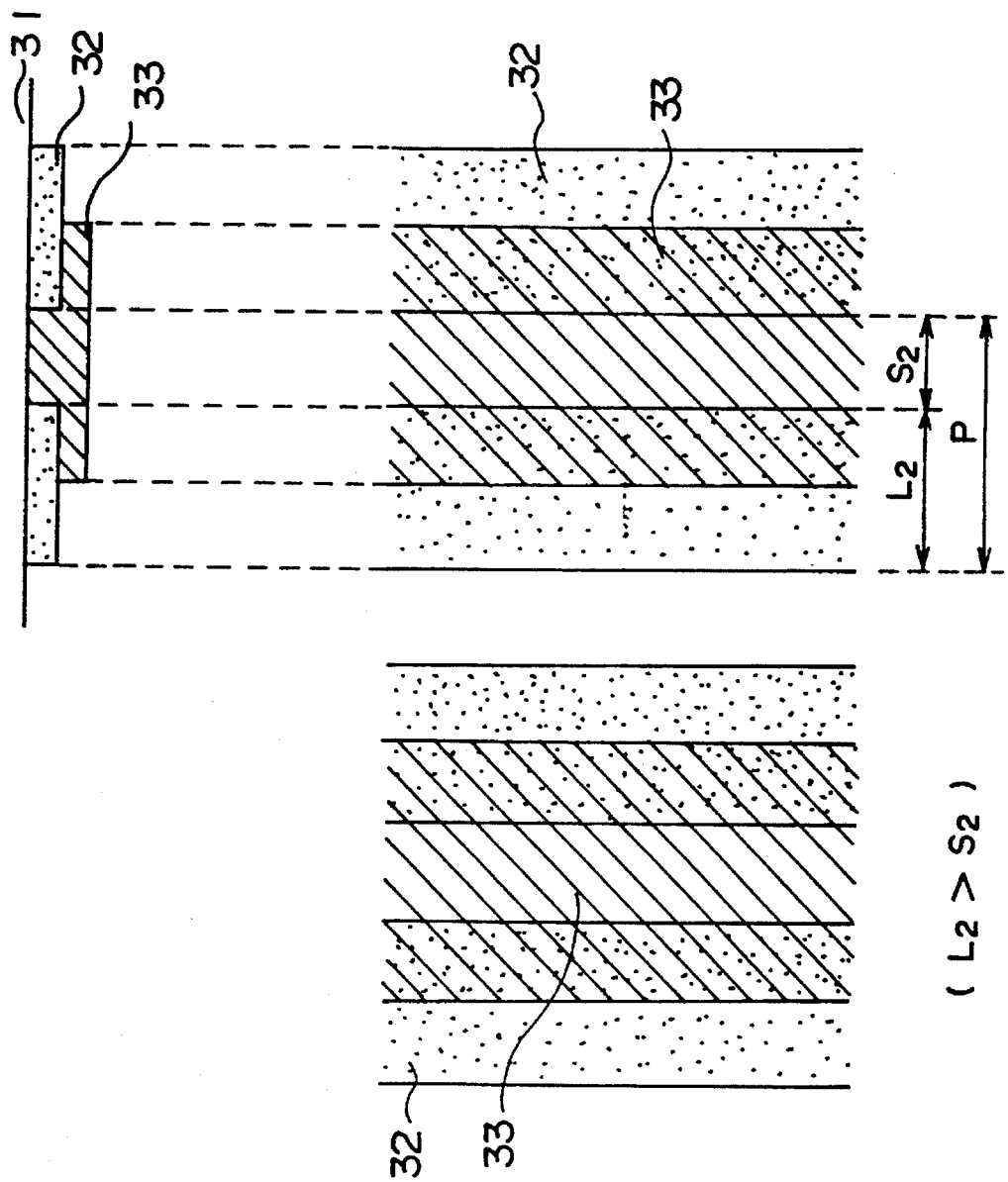
FIG. 2 is a view showing cross-sectional and plan views of a photomask according to a first embodiment of the present invention.

FIG. 2 shows cross-sectional and plan views of a photomask according to a first embodiment of the present invention.

In FIG. 2, a plurality of chromium patterns 32 are formed on a mask substrate 31. The chromium patterns 32 are composed of straight lines which are respectively arranged in parallel to one another at a given pitch. The areas on which the chromium patterns 32 are formed are opaque areas, while the other areas are light-transmissive areas.

Thin films (phase shifters) 33 for shifting the phase of light are formed alternately on the light-transmissive areas between the chromium patterns 32. Differences between the photomask according to the present invention and conventional phase shifting are that (1) the widths $L_2$ of the chromium patterns 32 are larger than those of the space $S_2$ therebetween and (2) the widths $L_2$ of the chromium patterns 32 are larger than the desired widths of line patterns which are to be formed on a positive resist.

Figure 3:
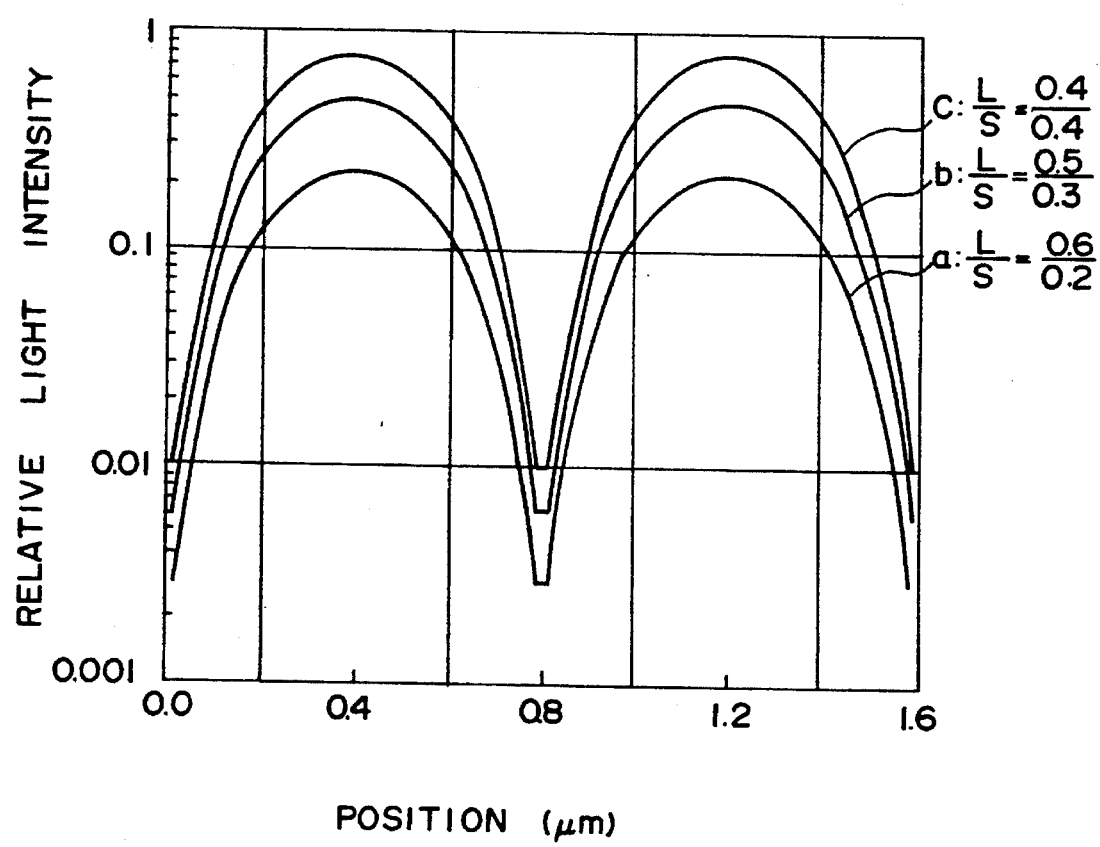
FIG. 3 is a graph showing the distribution of light intensity on the wafer.

FIG. 3 is a graph showing the distribution of light intensity on the wafer when light is projected through the phase shifting mask thereto, wherein a projector having a numerical aperture NA of 0.42 is used for exposure.

In the figure, line a shows the distribution of light intensity wherein the widths L of the chromium patterns 32 are 0.6 μm and those of the space S therebetween are 0.2 μm. Line b shows the distribution of light intensity wherein L is 0.5 μm and S is 0.3 μm and line c shows the distribution of light intensity wherein both L and S are 0.4 μm respectively. In either case, the pitch P is 0.8 μm.

As evident from this graph, the wider the width L of the chromium pattern ($L_2$ in FIG. 2), the lower the intensity of light is. But the contrast thereof remains unchanged.

The method of forming a resist pattern using a photomask according to the present invention will be described hereinafter.

At first, chromium patterns are strayed at a pitch F of 0.6 μm on mask substrate 31 so as to form a positive resist pattern of 0.3 μm L/S (line and space). The width of the chromium pattern is 0.4 μm and the space therebetween is 0.2 μm. Phase shifters are alternately formed on the light-transmissive areas between the chromium patterns.

Thereafter, a positive type photoresist PFRIX500EL (made by Japan Synthetic Rubber Co.) is applied to a silicon substrate (wafer) having a diameter of 3 inches. The photoresist layer on the wafer is baked for 60 minutes at 90° C. Then the photomask is arranged on the surface of the photoresist layer of the wafer. The photoresist layer is exposed to light through the photomask set forth above by an i-line stepper RA101VL II (Hitachi). The exposure time ranges between 0.2 second and 1.0 second. Each chip area of the wafer is sequentially exposed to light at 0.02 second intervals. The wafer is baked for 90 seconds at 110° C. after the exposure and is subjected to paddle development in a developer NMD.W (Tokyo Ohka Kogyo Co. Ltd.) for 60 seconds to obtain photoresist patterns.

Figure 4:
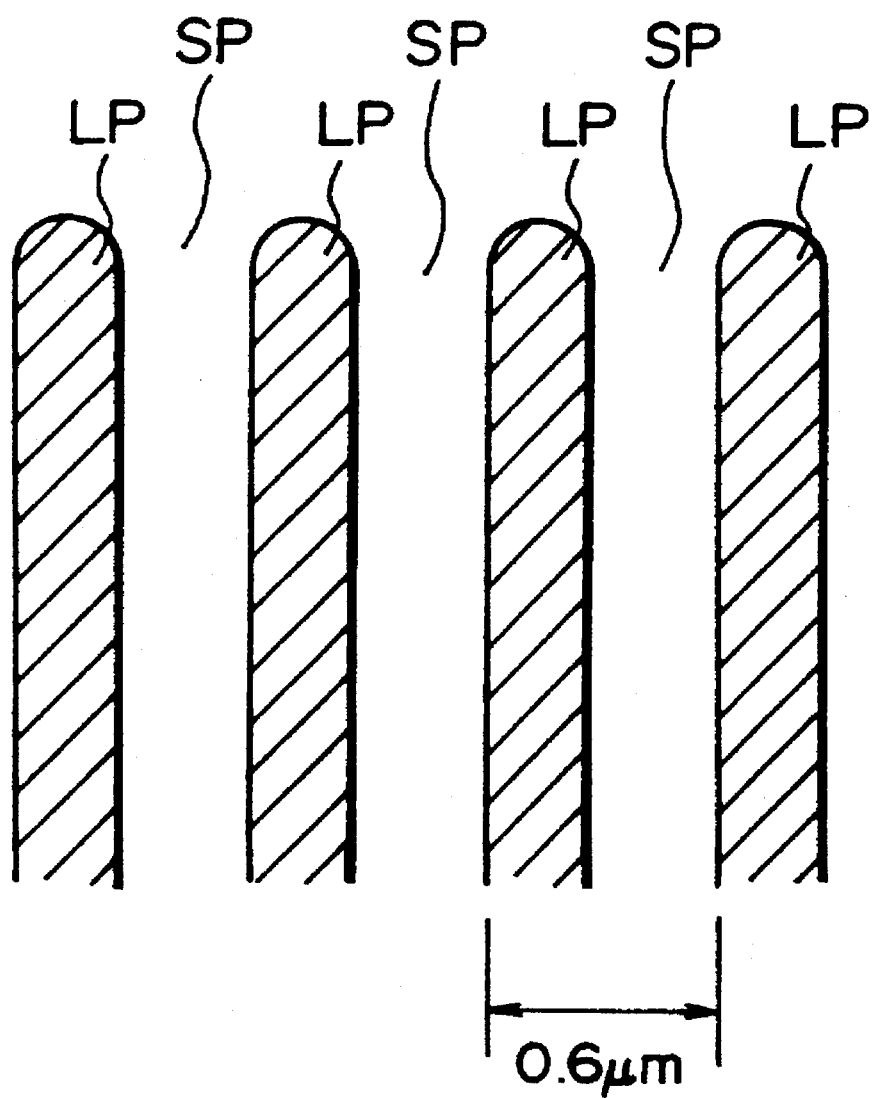
FIG. 4 is a diagram showing a resist pattern obtained by exposure employing the photomask according to the present invention.

The photoresist patterns on a wafer formed through 0.8 second exposure is observed under SEM (scanning electron microscopy). A resist pattern of 0.3 μm L/S with no transfer of phase shifters thereon is formed as illustrated in FIG. 4. In FIG. 4, designated at LP is a line pattern and SP is a space pattern.

Figure 1:
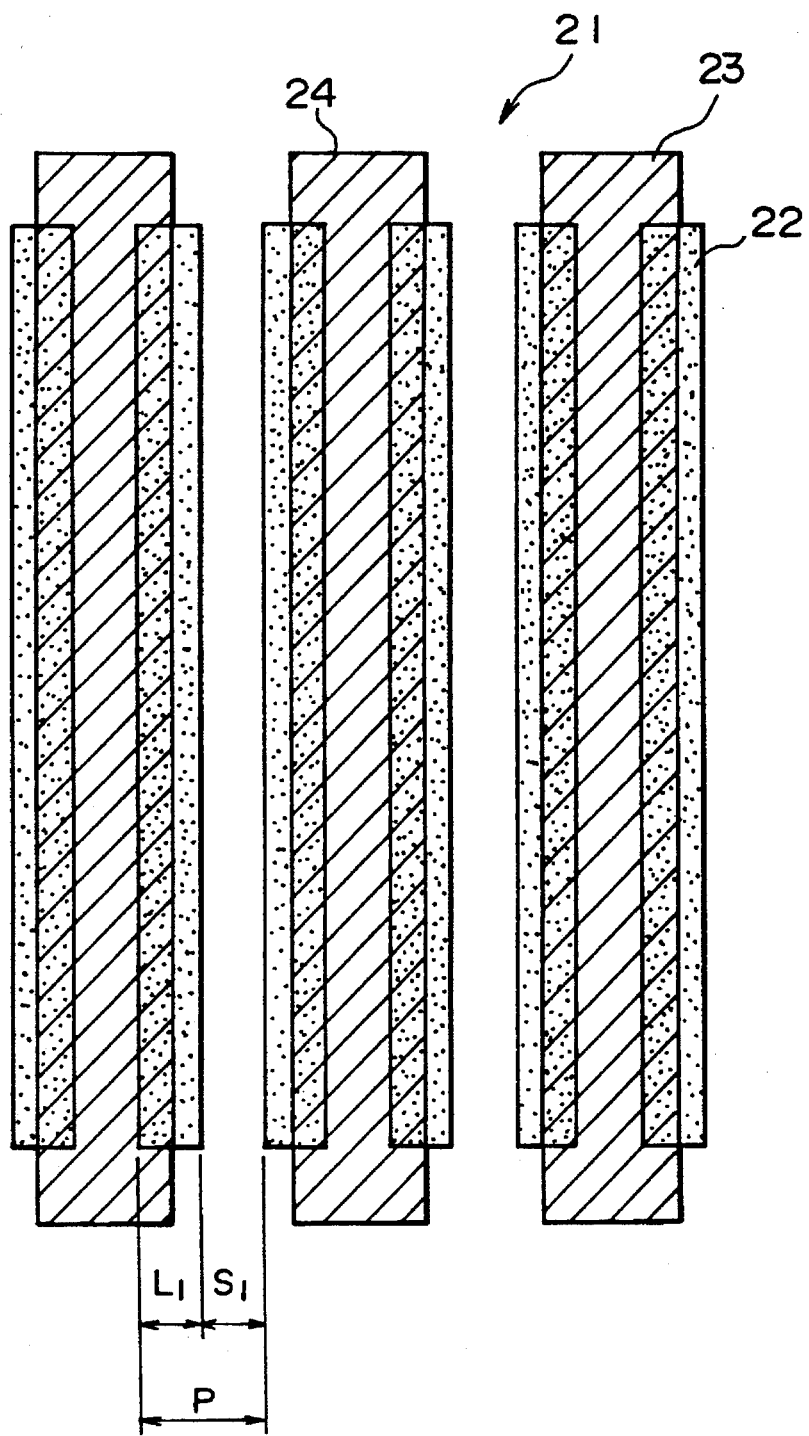
FIG. 1 is a plan view showing a mask pattern of a conventional phase shifting mask.

On the other hand, when a wafer is exposed to light for 0.52 second through the conventional photomask as shown in FIG. 1, the edges of the phase shifters on the light-transmissive area are transferred to the wafer. When the amount of light for exposure is increased in order to prevent the transfer, no line pattern is formed on the wafer.

Figure 5A:
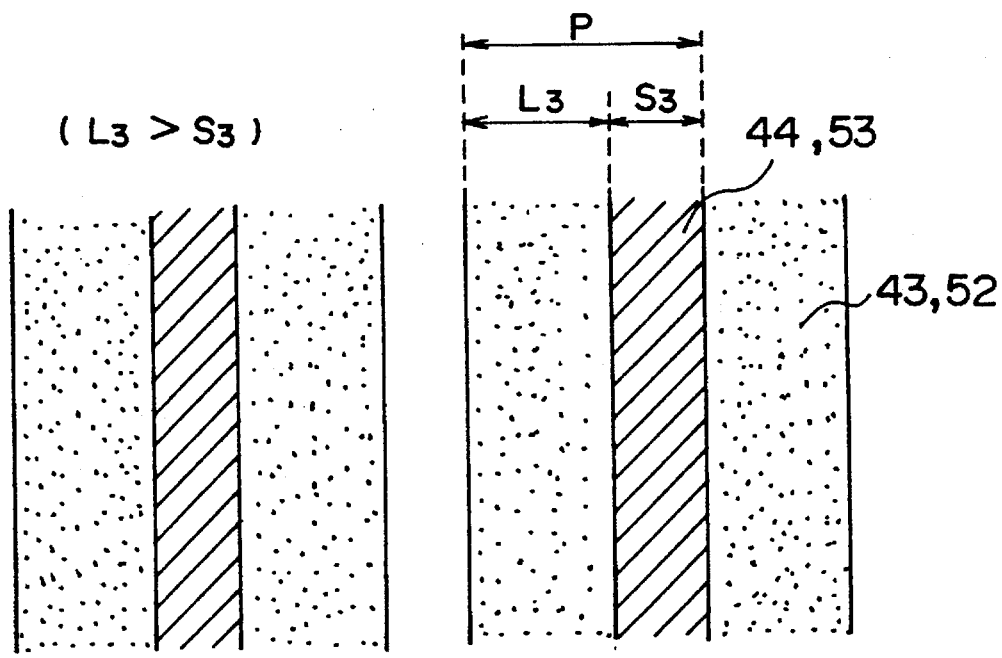
FIG. 5(A) and FIG. 5(B) are a plan view and a cross-sectional view of a photomask according to a second embodiment of the present invention, respectively.
Figure 5B:
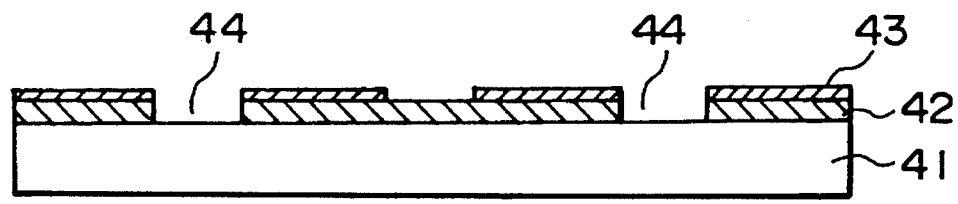

FIGS. 5(A) and 5(B) show a photomask according to the second embodiment of the present invention, wherein FIG. 5(A) is a plan view and FIG. 5(B) is a cross-sectional view of the photomask.

In FIGS. 5(A) and 5(B), first phase shifter layers 42 are formed on a mask substrate 41, on which chromium layers 43 are formed. The chromium layers 43 are subjected to patterning so as to form an array of opaque stripes 43 respectively arranged at a given pitch P. The widths $L_3$ of the stripes 43 are larger than those of the spaces $S_3$ therebetween.

Then the phase shifting layers 42 on the areas between the stripes 43 are alternately removed to form phase shifting portions 44.

For example, SOG (Spin on Glass) Type-7 (Tokyo Ohka Kogyo Co. Ltd.) which is 4100 Å in thickness is applied to the surface of a 5 inches square quartz substrate and thereafter is baked for 30 minutes at 400° C. A $SiO_2$ or photoresist may be used as a shifting layer.

Then a chromium layer as thick as 800 Å is formed on the shifting layer 42 by spattering and is subjected to the conventional mask forming process so as to form the opaque stripes 43 on the shifting layer 42.

In this embodiment, the opaque stripes 43 having a width of 0.4 μm are formed at a pitch of 0.6 μm.

Figure 6:
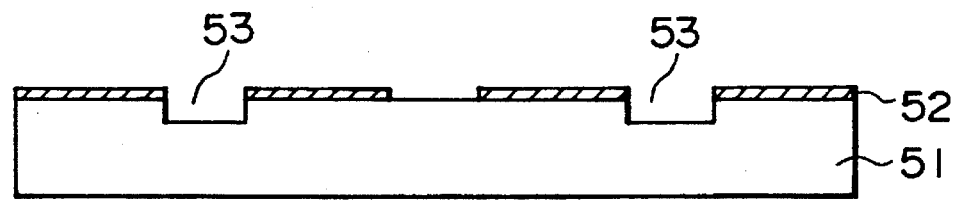
FIG. 6 is a cross-sectional view of a photomask according to a modified embodiment of FIG. 5.

FIG. 6 shows a modified embodiment of the photomask shown in FIGS. 5(A) and 5(B). According to this embodiment, opaque stripes 52 of chromium layer are formed on a mask base plate 51. Thereafter the areas between the stripes 52 are alternately subjected to etching so as to form grooves acting as the phase shifting area 53.

As described above, according to the present invention, the transfer of the edge portions of the phase shifters to the wafer is prevented by making the widths of the opaque stripes respectively arranged at a given pitch wider than those of the spaces therebetween.

What is claimed is:

1. A method of forming a line and space resist pattern by projection exposure of a positive type resist, comprising the steps of:

providing a photomask including
      a mask substrate comprising light-transmissive material;
      an array of opaque stripes having spaces therebetween formed on said substrate, said opaque stripes being arranged on said substrate at a given pitch and having widths which are greater than the spaces between adjacent opaque stripes; and
      phase shifters formed on said substrate in the spaces between every other opaque stripe; and
   performing projection exposure on said positive resist using said photomask in a single step for enough time to prevent transfer of edges of said phase shifters onto said resist pattern and to enable a line and a space of said resist pattern to have substantially the same width.

2. The method claimed in claim 1, wherein said performing step comprises performing projection exposure using said photomask for a period of time between about 0.2 second to about 1.0 second.

3. The method claimed in claim 2 wherein said performing step comprises performing projection exposure using said photomask for about 0.8 second.

4. A method of forming a line and space resist pattern by projection exposure of a positive type resist comprising the steps of:

providing a photomask including
      a mask substrate comprising light-transmissive material;
      opaque stripes having spaces therebetween formed on said substrate, said opaque stripes being arranged on said substrate at a given pitch, each of said opaque stripes having a first width; and
      phase shifters having edges thereon, said phase shifters being formed on light transmissive areas of said substrate in the spaces between every other opaque stripe, said spaces having second widths, the first widths of said opaque stripes being larger than said second widths; and
   performing projection exposure on said positive resist using said photomask in one step for enough time to prevent transfer of the edges of said phase shifters onto said resist pattern and to enable a line and a space of said resist pattern to have substantially the same width.

5. A method of forming a line and space resist pattern by projection exposure of a positive type resist, the line and the space of said resist pattern having substantially the same width, comprising the steps of:

providing a photomask including
      a mask substrate comprising light-transmissive material;
      an array of opaque stripes having spaces therebetween formed on said substrate, said opaque stripes being arranged on said substrate at a given pitch, each opaque stripe having a width which is greater than the spaces between adjacent opaque stripes and greater than the widths of the lines and spaces of said resist pattern; and phase shifters formed on said substrate in the spaces between alternate opaque stripes, each of said phase shifters having an edge contiguous with the light-transmissive material of said mask substrate; and performing projection exposure on said positive resist using said photomask in a single step for enough time to prevent transfer of the edges of said phase shifters onto said resist pattern and to enable a line and a space of said resist pattern to have substantially the same width.

* * * * *